(12) United States Patent
Tian

(10) Patent No.: US 11,838,019 B2
(45) Date of Patent: Dec. 5, 2023

(54) OPTICAL FINGERPRINT IDENTIFICATION CIRCUIT AND DISPLAY PANEL

(71) Applicant: WUHAN CHINA STAR OPTOELECTRONICS TECHNOLOGY CO., LTD., Hubei (CN)

(72) Inventor: Chao Tian, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 710 days.

(21) Appl. No.: 16/965,367

(22) PCT Filed: Jun. 23, 2020

(86) PCT No.: PCT/CN2020/097760
§ 371 (c)(1),
(2) Date: Jul. 28, 2020

(87) PCT Pub. No.: WO2021/248561
PCT Pub. Date: Dec. 16, 2021

(65) Prior Publication Data
US 2021/0384904 A1    Dec. 9, 2021

(30) Foreign Application Priority Data
Jun. 9, 2020   (CN) .......................... 202010516026.7

(51) Int. Cl.
*G06V 40/13*      (2022.01)
*H03K 17/94*      (2006.01)
*H01L 27/146*     (2006.01)

(52) U.S. Cl.
CPC ....... *H03K 17/941* (2013.01); *G06V 40/1318* (2022.01); *H01L 27/14612* (2013.01); *H01L 27/14643* (2013.01)

(58) Field of Classification Search
None
See application file for complete search history.

(56) References Cited

U.S. PATENT DOCUMENTS 10,607,539 B2 * 3/2020 Chen ................... G09G 3/3233
11,605,352 B2 * 3/2023 Wang ................... G09G 3/3266
(Continued)

FOREIGN PATENT DOCUMENTS

CN   108062540 A   5/2018
CN   108280432 A   7/2018
(Continued)

*Primary Examiner* — Hoon K Song
(74) *Attorney, Agent, or Firm* — PV IP PC; Wei Te Chung; Zhigang Ma

(57) ABSTRACT

An optical fingerprint identification circuit and a display panel are provided. The optical fingerprint identification circuit adds a reset unit at the gate of the driving transistor. The anode of the photodiode is electrically connected to the scan line. The optical fingerprint identification circuit could effectively avoid the reverse breakdown risk of the photodiode while realizing the fingerprint identification. It could reduce the requirement for the reverse breakdown voltage of the photodiode and requirement for the performance of the sensor. Furthermore, the circuit structure is simpler and the number of the TFTs is reduced. This improves the integration of the circuit.

20 Claims, 3 Drawing Sheets

(56) References Cited

U.S. PATENT DOCUMENTS

| | | | |
|---|---|---|---|
| 2019/0279566 A1 | 9/2019 | Wang | |
| 2021/0225286 A1* | 7/2021 | Wang | G09G 3/3291 |
| 2023/0144932 A1* | 5/2023 | Zhao | H10K 39/34 |
| | | | 382/124 |

FOREIGN PATENT DOCUMENTS

| | | |
|---|---|---|
| CN | 110097038 A | 8/2019 |
| CN | 110728254 A | 1/2020 |
| CN | 110765888 A | 2/2020 |

* cited by examiner

OPTICAL FINGERPRINT IDENTIFICATION CIRCUIT AND DISPLAY PANEL

FIELD OF THE INVENTION

The present invention relates to a fingerprint identification technique, and more particularly, to an optical fingerprint identification circuit and a display panel.

BACKGROUND

Fingerprint is an identification of a person, which could be used to distinguish the person from the others. The pattern of the fingerprint is unique and is formed by a series of crests and troughs of the skin surface. The fingerprint identification technique is known for identifying an individual. The optical fingerprint identification technique, such as fingerprint lock or fingerprint attendance machine, is widely used in our daily life. The optical fingerprint identification technique utilizes reflection and refraction of light. That is, the finger reflects the light and the reflected light is received by the sensor. The sensor transforms the light signal into the electric signal. Because the reflected light of finger crests and troughs are different such that the light luminance sensed by the sensor is also different and thus the corresponding voltages or currents are difference. Therefore, a specific point of the fingerprint could be identified to provide the unique information. However, the optical system has a larger size and thus is more difficult to be used in many applications.

As the development of the full-screen smart phone, the in-screen optical fingerprint identification is popular. Because of organic light emitting diode (OLED) display panel, the optical fingerprint identification system could avoid a complicated and huge optical system. Based on the low temperature poly-silicon technique, the under-screen fingerprint identification becomes possible. However, the optical sensor using OLED display panel has a lower luminance. This make the photocurrent of the optical sensor lower and makes it more difficult to get and process the signal.

Conventionally, the active driving method is utilized to output a pixel signal to raise the fingerprint identification efficiency. However, the conventional active driving method requires more TFTs and thus is difficult to be integrated. In contrast, the structure having fewer TFTs requires a sensor with better sensitivity and performance. This raises the requirement for the performance of the sensor and thus is not easy for promotion.

SUMMARY

One objective of an embodiment of the present invention is to provide an optical fingerprint identification circuit and a display panel, which could reduce the requirement for the reverse breakdown voltage of the photodiode while realizing the fingerprint identification. That is, the requirement for the performance of the sensor could be reduced.

According to an embodiment of the present invention, an optical fingerprint identification circuit is disclosed. The optical fingerprint identification circuit comprises: a driving transistor, configured to output a light signal to perform a fingerprint identification; a reset unit, configured to transfer a reset voltage in response to a reset signal to reset a gate voltage of the driving transistor; a photodiode, comprising: an anode electrically connected to a scan line to receive a scan signal; and an cathode electrically connected to a gate of the driving transistor; wherein the photodiode is configured to enter a reversed bias state in respond to a scan signal of a first voltage level, to be exposed by a light signal having an amplitude corresponding to a fingerprint crest or fingerprint trough for generating a corresponding photocurrent to discharge a gate of the driving transistor, and to enter a forward bias state in response to a scan signal of a second voltage level; and a coupling capacitor, configured to turn on the driving transistor in respond to the scan signal of the second voltage level; wherein the second voltage level is higher than the first voltage level.

According to an embodiment of the present invention, an optical fingerprint identification circuit is disclosed. The optical fingerprint identification circuit comprises: a driving transistor, configured to output a light signal to perform a fingerprint identification; a photodiode, configured to enter a reversed bias state in respond to a scan signal of a first voltage level, to generate a photocurrent according to a light signal and output the photocurrent to a gate of the driving transistor, and to enter a forward bias state in response to a scan signal of a second voltage level, wherein the second voltage level is higher than the first voltage level; a reset unit, configured to transfer a reset voltage in response to a reset signal to reset a gate voltage of the driving transistor; and a coupling capacitor, configured to turn on the driving transistor in respond to the scan signal of the second voltage level.

According to an embodiment of the present invention, a display panel is disclosed. The display panel comprises an array substrate. The array substrate comprises a fingerprint identification circuit. The optical fingerprint identification circuit comprises: a driving transistor, configured to output a light signal to perform a fingerprint identification; a photodiode, configured to enter a reversed bias state in respond to a scan signal of a first voltage level, to generate a photocurrent according to a light signal and output the photocurrent to a gate of the driving transistor, and to enter a forward bias state in response to a scan signal of a second voltage level, wherein the second voltage level is higher than the first voltage level; a reset unit, configured to transfer a reset voltage in response to a reset signal to reset a gate voltage of the driving transistor; and a coupling capacitor, configured to turn on the driving transistor in respond to the scan signal of the second voltage level.

An embodiment of the present invention could effectively avoid the reverse breakdown risk of the photodiode while realizing the fingerprint identification. That is, it could reduce the requirement for the reverse breakdown voltage of the photodiode and requirement for the performance of the sensor. Furthermore, the circuit structure is simpler and the number of the TFTs is reduced. This improves the integration of the circuit.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DETAILED DESCRIPTION OF PREFERRED EMBODIMENTS

Figure 1:
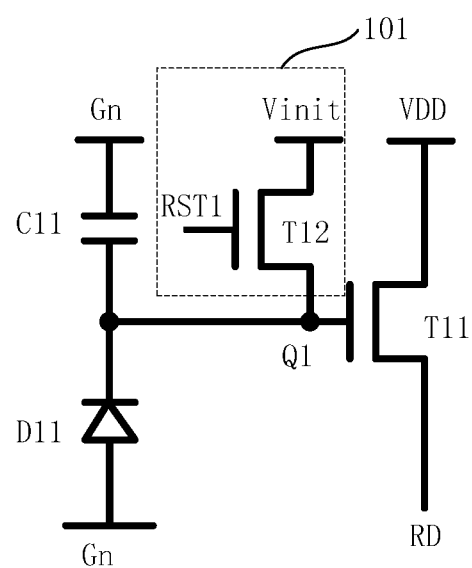
FIG. 1 is a diagram of an optical fingerprint identification circuit according to an embodiment of the present invention.

The terminology used herein is for the purpose of describing particular embodiments only and is not intended to be limiting of the invention. As used herein, the singular forms "a", "said" and "the" are intended to include the plural forms as well, unless the context clearly indicates otherwise. It will be understood that the term "and/or," when used in this specification, specify one or more associated elements, alone or in combination, are provided. It will be further understood that the terms "first," "second," "third," and "fourth," when used in this specification, claim and drawings, are used to distinguish different objects, rather than to describe a specific order. It will be further understood that the terms "comprises" and/or "comprising," when used in this specification, specify the presence of stated features, products, steps, operations, elements, and/or components, but do not preclude the presence or addition of one or more other features, products, steps, operations, elements, components, and/or groups thereof.

All of the terminologies containing one or more technical or scientific terminologies have the same meanings that persons skilled in the art understand ordinarily unless they are not defined otherwise. For example, "arrange," "couple," and "connect," should be understood generally in the embodiments of the present disclosure. For example, "firmly connect," "detachably connect," and "integrally connect" are all possible. It is also possible that "mechanically connect," "electrically connect," and "mutually communicate" are used. It is also possible that "directly couple," "indirectly couple via a medium," and "two components mutually interact" are used.

In an embodiment, an optical fingerprint identification circuit is disclosed. The optical fingerprint identification circuit adds a reset unit at the gate of the driving transistor. The anode of the photodiode is electrically connected to the scan line. In the reset stage, the reset unit is used to reset the gate of the driving transistor. In the exposure stage, the photodiode is in the reverse bias state, is exposed by a light having amplitudes corresponding to the fingerprint crests or the fingerprint troughs, and discharges the gate of the driving transistor to pull down the gate voltage of the driving transistor. In the reading stage, the coupling capacitor is used to perform a voltage coupling operation on the gate of the driving transistor to turn on the driving transistor to output the light signal. At this time, the voltages of the two ends of the photodiode are simultaneously pulled up without increasing the reverse bias voltage. An embodiment of the present invention could effectively avoid the reverse breakdown risk of the photodiode while realizing the fingerprint identification. That is, it could reduce the requirement for the reverse breakdown voltage of the photodiode and requirement for the performance of the sensor. Furthermore, the circuit structure is simpler and the number of the TFTs is reduced. This improves the integration of the circuit.

Figure 2:
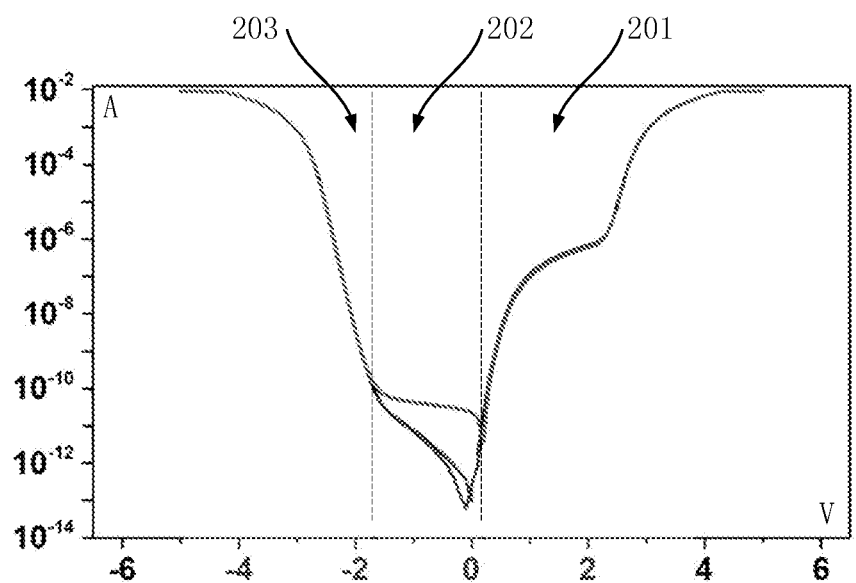
FIG. 2 is a diagram showing a current-voltage (I-V) curve of a photodiode.
Figure 3:
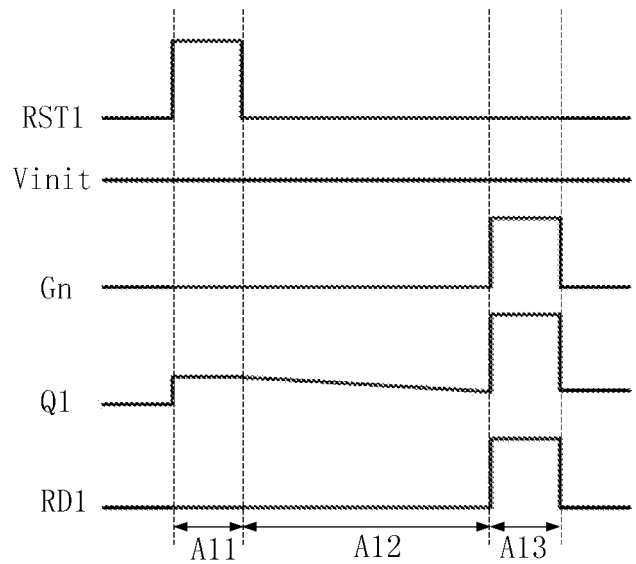
FIG. 3 is a driving timing diagram of the optical fingerprint identification circuit shown in FIG. 1.

Please refer to FIGS. 1-3. FIG. 1 is a diagram of an optical fingerprint identification circuit according to an embodiment of the present invention. FIG. 2 is a diagram showing a current-voltage (I-V) curve of a photodiode. The x-axis represents voltage (unit: V) and the y-axis represents current (unit: A). FIG. 3 is a driving timing diagram of the optical fingerprint identification circuit shown in FIG. 1.

As shown in FIG. 1, the optical fingerprint identification circuit comprises a driving transistor T11, a photodiode D11, a reset unit 101, and a coupling capacitor C11. The reset unit 101 is configured to transfer a reset voltage Vinit in response to a reset signal RST1 to reset a gate voltage of the driving transistor T11. The photodiode D11 is configured to enter a reversed bias state in respond to the scan signal Gn of a first voltage level, to generate a photocurrent according to a light signal and output the photocurrent to a gate of the driving transistor T11. The coupling capacitor C11 is configured to turn on the driving transistor T11 in respond to the scan signal Gn of a second voltage level. The driving transistor is configured to output the light signal to perform the fingerprint identification. The photodiode D11 is further configured to enter a forward bias state in response to the scan signal Gn of the second voltage level.

After entering the reversed bias state, the photodiode D11 is exposed by the light signal having amplitudes corresponding to fingerprint crests or fingerprint troughs for generating the corresponding photocurrent to discharge the gate of the driving transistor T11 such that the gate voltage of the driving transistor T11 is pulled down. The light signals of different amplitudes have different abilities of discharging the gate of the driving transistor T11 such that the voltage drops of the gate voltage of the driving transistor T11 are different. This feature could be used for fingerprint identification.

The photodiode is a semiconductor device having a PN junction. The photodiode is conductive in one direction and is capable of transforming a light signal into an electric signal. In an embodiment, the area of the PN junction is preferably larger to receive an input light. The photodiode is working in the reverse bias state. The reverse current is extremely low when there is no light and thus is called a dark current. When there is light, the reverse current quickly increases to tens of amps and is called as photocurrent. The reverse current becomes larger when the light amplitude is larger. The variance of the light also introduces the current variance of the photodiode. In this way, the photodiode could transform the light signal into the electric signal.

As shown in FIG. 2, the working state of the photodiode could be divided into the forward bias state 201, the reverse bias state 202 and the reverse breakdown state 203. When the absolute value of the reverse voltage of the photodiode is larger than maximum absolute value of the reverse voltage in the reverse bias state, the photodiode enters the reverse breakdown state. In an embodiment, when the driving transistor T11 outputs the light signal, the photodiode is switched from the reverse bias state into the forward bias state. In order to ensure that the driving transistor T11 is successfully turned on, the gate voltage needs to be high enough. However, because the two ends of the photodiode D11 are pulled up at the same time, the reverse voltage across the photodiode D11 does not increase. This could efficiently reduce the reverse breakdown risk and reduce the requirement for the reverse breakdown voltage of the photodiode D11. That is, the requirement for the performance of the sensor is reduced.

Please refer to FIG. 1. The reset unit 101 comprises a reset transistor T12. The reset transistor T12 has a control end electrically connected to a reset scan line, configured to receive the reset signal RST1; a first end, configured to receive the reset voltage; and a second end, electrically connected to the gate of the driving transistor T11. The reset transistor T12 is turned on under the control of the reset signal RST1 to transfer the reset voltage Vinit to the gate of the driving transistor T11 to perform the reset operation. That is, in the reset stage, the gate voltage of the driving transistor T11 is equal to the reset voltage Vinit. The reset voltage Vinit is lower than the turn-on voltage of the driving transistor T11 to prevent the driving transistor T11 from being turned on in the reset stage.

The reset transistor T12 is implemented with a TFT, such as a low temperature poly-silicon TFT (LTPS_TFT). The gate of the TFT is used as a control end of the reset transistor T12.

In this embodiment, the anode of the photodiode D11 is electrically connected to a scan line for receiving the scan signal Gn. The cathode of the photodiode D11 is electrically connected to the gate of the driving transistor T11. The photodiode D11 enters the reverse bias state when the scan signal Gn corresponds to the first voltage level and enters the forward bias state when the scan signal Gn corresponds to the second voltage level. Here, the second voltage level is higher than the first voltage level. For example, the second voltage level is a high voltage level and the first voltage level is a low voltage level such that the photodiode D11 could realize the forward bias/forward bias.

In this embodiment, the photodiode D11 is an organic light emitting diode (OLED).

The first end of the coupling capacitor C11 and the anode of the photodiode D11 are both electrically connected to the same scan line for receiving the same scan signal Gn. The second end of the coupling capacitor C11 is electrically connected to the gate of the driving transistor T11. The coupling capacitor C11 performs the voltage coupling operation on the gate of the driving transistor T11 when the scan signal Gn corresponds to the second voltage level to pull up the gate voltage of the driving transistor such that the driving transistor is turned on. Because the coupling capacitor C11 performs the voltage coupling operation, the gate voltage of the driving transistor T11 rises. When the gate voltage of the driving transistor T11 is higher than the turn-on voltage of the driving transistor T11, the driving transistor T11 is turned on to output a light signal.

In this embodiment, the first end of the driving transistor T11 is used to receive a power voltage VDD. The second end of the driving transistor T11 is electrically connected to a data readout line RD. When the driving transistor T11 is turned on, the driving transistor T11 outputs the light signal to the data readout line RD. The corresponding IC could receive the light signal through the data readout line to perform the fingerprint identification.

The driving transistor T11 could be implemented with a TFT, such as a LTPS_TFT. This could facilitate the manufacture and in-screen integration.

Please refer to FIG. 1 and FIG. 3. The working mechanism of the optical fingerprint identification circuit is illustrated as follows:

(1) Reset stage A11: The scan signal Gn corresponds to a low voltage level (Low). The reset signal RST1 corresponds to a high voltage level (High). The reset transistor T12 is turned on to input the reset voltage Vinit to the gate (Q1) of the driving transistor T11. The voltage of the node Q1 is equal to the reset voltage Vinit.

(2) Exposure stage A12: The reset signal RST1 is switched to a low voltage level. The reset transistor T12 is turned off. The scan signal Gn still corresponds to a low voltage level. Because the voltage level of the node Q1 is higher, the photodiode D11 is reverse biased. The photodiode D11 is exposed by the light signals having amplitudes corresponding fingerprint crests or fingerprint troughs. When the light is applied on the photodiode D11, the photodiode D11 generates a photocurrent. The photocurrent discharges the node Q1 such that the voltage level of the node Q1 drops. Different light amplitude causes different voltage drops.

(3) Read stage A13: The scan signal Gn is switched to a high voltage level and is coupled to the node Q1 through the coupling capacitor C11 to perform the voltage coupling operation such that the voltage level of the node Q1 rises. When the voltage level of the node Q1 is larger than the turn-on voltage of the driving transistor T11, the driving transistor T11 is turned on and outputs the light signal to the data readout line RD (in FIG. 3, RD3 represents the obtained light signal). The light signal is outputted to the corresponding IC through the data readout line RD. In this stage, because the two ends of the photodiode D11 rise at the same time (Gn is switched to a high voltage level and the voltage level of the node Q1 rises as well), the reverse voltage across the photodiode D11 does not increase. This could efficiently avoid the reverse breakdown risk.

Figure 4:
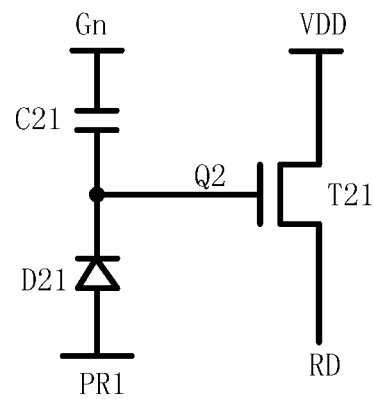
FIG. 4 is a diagram of a conventional optical fingerprint identification circuit.
Figure 5:
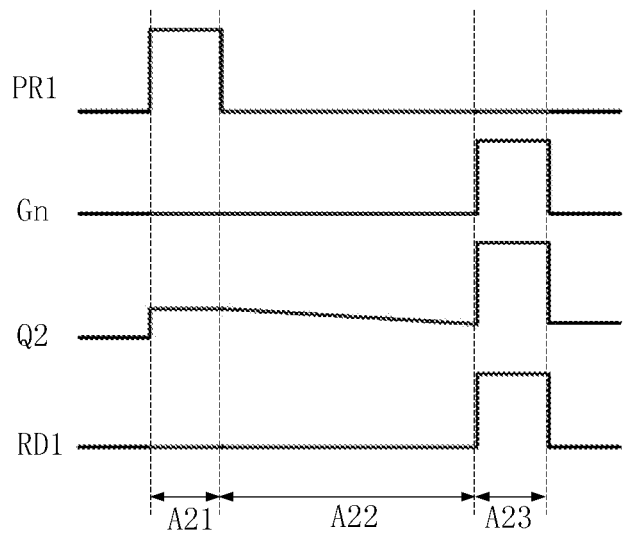
FIG. 5 is a driving timing diagram of the optical fingerprint identification circuit shown in FIG. 4.

In contrast, please refer to FIG. 4 and FIG. 5. FIG. 4 is a diagram of a conventional optical fingerprint identification circuit. FIG. 5 is a driving timing diagram of the optical fingerprint identification circuit shown in FIG. 4.

As shown in FIG. 4, the anode of the photodiode is electrically connected to a reset signal line for receiving the reset signal PR1 to reset the driving transistor T21. The coupling capacitor C21 is electrically connected to a scan line for receiving a scan signal Gn to control the on/off state of the driving transistor T21.

Please refer to FIG. 4 in conjunction with FIG. 5. The working mechanism of the conventional optical fingerprint identification circuit is as follows:

(a) Reset stage A21: The scan signal Gn corresponds to a low voltage level (Low). The reset signal PR1 corresponds to a high voltage level (High). The photodiode D21 is forward biased to reset the gate (shown as Q2) of the driving transistor T21.

(b) Exposure stage A22: The reset signal PR1 is switched to a low voltage level. The photodiode D21 is in the reverse bias state. The photodiode D21 is exposed by the light signals having amplitudes corresponding fingerprint crests or fingerprint troughs to generate a photocurrent. The photocurrent discharges the node Q2 such that the voltage level of the node Q2 drops. Different light amplitude causes different voltage drops.

(c) Read stage A23: The scan signal Gn is switched to a high voltage level and is coupled to the node Q2 through the coupling capacitor C21 to perform the voltage coupling operation such that the voltage level of the node Q2 rises. When the voltage level of the node Q2 is larger than the turn-on voltage of the driving transistor T21, the driving transistor T21 is turned on to output the light signal to the data readout line RD (in FIG. 5, RD1 represents the obtained light signal).

In order to ensure that the driving transistor T21 could be successfully turned on, the voltage level of the node Q2 needs to be high enough such that the reverse voltage of the photodiode D21 becomes high. This creases the reverse breakdown risk. Therefore, the breakdown voltage of the photodiode D21 to prevent breakdown. This requires the sensor to have a better performance.

In addition, a display panel is disclosed.

Figure 6:
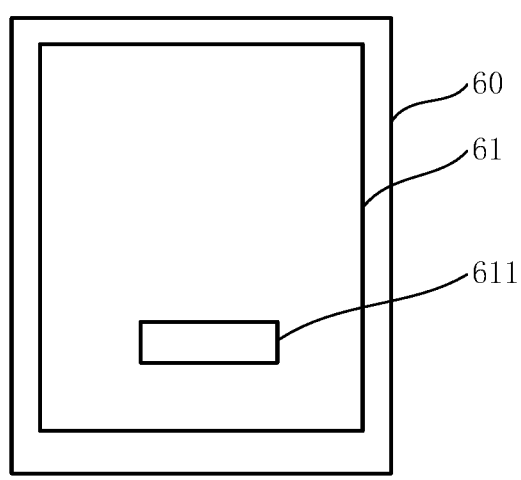
FIG. 6 is a diagram of a display panel according to an embodiment of the present invention.

Please refer to FIG. 6. FIG. 6 is a diagram of a display panel according to an embodiment of the present invention. The display panel 60 comprises an array substrate 61. The array substrate 61 comprises at least one optical fingerprint identification circuit 611. The optical fingerprint identification circuit 611 could be the optical fingerprint identification circuit shown in FIG. 1. The detailed circuit configuration and operations are illustrated above and thus omitted here.

The display panel adopting the optical fingerprint identification circuit could effectively avoid the reverse breakdown risk of the photodiode while realizing the fingerprint identification. That is, it could reduce the requirement for the reverse breakdown voltage of the photodiode and requirement for the performance of the sensor. Furthermore, the circuit structure is simpler and the number of the TFTs is reduced. This improves the integration of the circuit.

Above are embodiments of the present invention, which does not limit the scope of the present invention. Any modifications, equivalent replacements or improvements within the spirit and principles of the embodiment described above should be covered by the protected scope of the invention.

What is claimed is:

1. An optical fingerprint identification circuit, comprising:
   a driving transistor, configured to output a light signal to perform a fingerprint identification;
   a reset unit, configured to transfer a reset voltage in response to a reset signal to reset a gate voltage of the driving transistor;
   a photodiode, comprising:
      an anode electrically connected to a scan line to receive a scan signal; and
      an cathode electrically connected to a gate of the driving transistor;
      wherein the photodiode is configured to enter a reversed bias state in respond to a scan signal of a first voltage level, to be exposed by a light signal having an amplitude corresponding to a fingerprint crest or fingerprint trough for generating a corresponding photocurrent to discharge a gate of the driving transistor, and to enter a forward bias state in response to a scan signal of a second voltage level; and
   a coupling capacitor, configured to turn on the driving transistor in respond to the scan signal of the second voltage level;
   wherein the second voltage level is higher than the first voltage level.

2. The optical fingerprint identification circuit of claim 1, wherein the reset unit comprises:
   a reset transistor, comprising:
      a control end electrically connected to a reset scan line, configured to receive the reset signal;
      a first end, configured to receive the reset voltage; and
      a second end, electrically connected to the gate of the driving transistor;
   wherein the reset transistor is turned on under a control of the reset signal to transfer the reset voltage to a gate of the driving transistor to perform a reset operation.

3. The optical fingerprint identification circuit of claim 2, wherein the reset transistor is implemented with a thin film transistor.

4. The optical fingerprint identification circuit of claim 1, wherein the coupling capacitor comprises:
   a first end, electrically connected to the scan line, configured to receive the scan signal; and
   a second end, electrically connected to the gate of the driving transistor;
   wherein the coupling capacitor performs a voltage coupling operation on the gate of the driving transistor when the scan signal corresponds to the second voltage level to pull up the gate voltage of the driving transistor such that the driving transistor is turned on.

5. The optical fingerprint identification circuit of claim 1, wherein the driving transistor comprises:
   a first end, configured to receive a power voltage; and
   a second end, electrically connected to a data readout line;
   wherein the driving transistor outputs the light signal to the data readout line when the driving transistor is turned on.

6. The optical fingerprint identification circuit of claim 1, wherein the photodiode is an organic light emitting diode.

7. The optical fingerprint identification circuit of claim 1, wherein the driving transistor is a thin film transistor.

8. An optical fingerprint identification circuit, comprising:
   a driving transistor, configured to output a light signal to perform a fingerprint identification;
   a photodiode, configured to enter a reversed bias state in respond to a scan signal of a first voltage level, to generate a photocurrent according to the light signal and output the photocurrent to a gate of the driving transistor, and to enter a forward bias state in response to a scan signal of a second voltage level, wherein the second voltage level is higher than the first voltage level;
   a reset unit, configured to transfer a reset voltage in response to a reset signal to reset a gate voltage of the driving transistor; and
   a coupling capacitor, configured to turn on the driving transistor in respond to the scan signal of the second voltage level.

9. The optical fingerprint identification circuit of claim 8, wherein the photodiode is configured to, after entering the reversed bias state, be exposed by the light signal having an amplitude corresponding to a fingerprint crest or fingerprint trough for generating the corresponding photocurrent to discharge a gate of the driving transistor such that the gate voltage of the driving transistor is pulled down.

10. The optical fingerprint identification circuit of claim 8, wherein the reset unit comprises:
    a reset transistor, comprising:
       a control end electrically connected to a reset scan line, configured to receive the reset signal;
       a first end, configured to receive the reset voltage; and
       a second end, electrically connected to the gate of the driving transistor;
    wherein the reset transistor is turned on under a control of the reset signal to transfer the reset voltage to a gate of the driving transistor to perform a reset operation.

11. The optical fingerprint identification circuit of claim 10, wherein the reset transistor is implemented with a thin film transistor.

12. The optical fingerprint identification circuit of claim 8, wherein the photodiode comprises:
    an anode, electrically connected to a scan line, configured to receive the scan signal; and
    a cathode, electrically connected to a gate of the driving transistor;
    wherein the photodiode is in the reverse bias state when the scan signal corresponds to the first voltage level and is in the forward bias state when the scan signal corresponds to the second voltage level.

13. The optical fingerprint identification circuit of claim 12, wherein the coupling capacitor comprises:
- a first end, electrically connected to the scan line, configured to receive the scan signal; and
- a second end, electrically connected to the gate of the driving transistor;
- wherein the coupling capacitor performs a voltage coupling operation on the gate of the driving transistor when the scan signal corresponds to the second voltage level to pull up the gate voltage of the driving transistor such that the driving transistor is turned on.

14. The optical fingerprint identification circuit of claim 8, wherein the driving transistor comprises:
- a first end, configured to receive a power voltage; and
- a second end, electrically connected to a data readout line;
- wherein the driving transistor outputs the light signal to the data readout line when the driving transistor is turned on.

15. The optical fingerprint identification circuit of claim 8, wherein the photodiode is an organic light emitting diode.

16. The optical fingerprint identification circuit of claim 8, wherein the driving transistor is a thin film transistor.

17. A display panel, comprising an array substrate that comprises an optical fingerprint identification circuit, the optical fingerprint identification circuit comprising:
- a driving transistor, configured to output a light signal to perform a fingerprint identification;
- a photodiode, configured to enter a reversed bias state in respond to a scan signal of a first voltage level, to generate a photocurrent according to the light signal and output the photocurrent to a gate of the driving transistor, and to enter a forward bias state in response to a scan signal of a second voltage level, wherein the second voltage level is higher than the first voltage level;
- a reset unit, configured to transfer a reset voltage in response to a reset signal to reset a gate voltage of the driving transistor; and
- a coupling capacitor, configured to turn on the driving transistor in respond to the scan signal of the second voltage level.

18. The display panel of claim 17, wherein the reset unit comprises:
- a reset transistor, comprising:
  - a control end electrically connected to a reset scan line, configured to receive the reset signal;
  - a first end, configured to receive the reset voltage; and
  - a second end, electrically connected to the gate of the driving transistor;
- wherein the reset transistor is turned on under a control of the reset signal to transfer the reset voltage to a gate of the driving transistor to perform a reset operation.

19. The display panel of claim 17, wherein the photodiode is configured to, after entering the reversed bias state, be exposed by the light signal having an amplitude corresponding to a fingerprint crest or fingerprint trough for generating the corresponding photocurrent to discharge a gate of the driving transistor such that the gate voltage of the driving transistor is pulled down.

20. The display panel of claim 17, wherein the photodiode comprises:
- an anode, electrically connected to a scan line, configured to receive the scan signal; and
- a cathode, electrically connected to a gate of the driving transistor;
- wherein the photodiode is in the reverse bias state when the scan signal corresponds to the first voltage level and is in the forward bias state when the scan signal corresponds to the second voltage level,
- wherein the coupling capacitor comprises:
- a first end, electrically connected to the scan line, configured to receive the scan signal; and
- a second end, electrically connected to the gate of the driving transistor;
- wherein the coupling capacitor performs a voltage coupling operation on the gate of the driving transistor when the scan signal corresponds to the second voltage level to pull up the gate voltage of the driving transistor such that the driving transistor is turned on.

\* \* \* \* \*